(12) United States Patent
Ruegg et al.

(10) Patent No.: US 6,501,324 B2
(45) Date of Patent: Dec. 31, 2002

(54) HIGH SPEED MULTIPLEXER

(75) Inventors: Michael Ruegg, Santa Cruz, CA (US); Sasan Cyrusian, Scotts Valley, CA (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/866,264

(22) Filed: May 25, 2001

(65) Prior Publication Data

US 2002/0175740 A1 Nov. 28, 2002

(51) Int. Cl.$^7$ .............................................. H03K 19/177
(52) U.S. Cl. ...................................... 327/408; 327/409
(58) Field of Search ................................ 327/406, 407, 327/437, 94, 409, 410

(56) References Cited

U.S. PATENT DOCUMENTS

| | | | |
|---|---|---|---|
| 5,280,202 A | * 1/1994 | Chan et al. | |
| 5,598,114 A | 1/1997 | Jamshidi | 327/408 |
| 5,796,535 A | 8/1998 | Tuttle et al. | 360/51 |
| 5,982,220 A | 11/1999 | Kim | 327/407 |
| 6,037,799 A | * 3/2000 | McClure | 327/525 |
| 6,137,340 A | 10/2000 | Goodell et al. | 327/403 |
| 6,160,437 A | 12/2000 | Kim et al. | 327/408 |
| 6,194,950 B1 | 2/2001 | Kibar et al. | 327/407 |

FOREIGN PATENT DOCUMENTS

| | | | |
|---|---|---|---|
| JP | 405252017 A | * 9/1993 | 327/407 |

OTHER PUBLICATIONS

4052*

"Synchronous Recording Channels—PRML & Beyond", rev. 5.61 14.E.18, 1999, published by Knowledge Tek, Inc., Broomfield, Colorado.

"PRML: Seagate Uses Space Age Technology" available on the Internet at http://www.seagate.com/support/kb/disc/prml.html, 2 pages., last accessed Apr. 9, 2001.

"Technologies—PRML" available on the Internet at http://www.idema.org/about/industry/ind_tech_prml.html, 1 page, last accessed Apr. 9, 2001.

"Reference Guide—Hard Disk Drives" available on the Internet at http://www.storagereview.com/guide2000/ref/hdd, 13 pages, last accessed Apr. 9, 2001.

"MR and PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.

"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

Primary Examiner—Dinh T. Le
(74) Attorney, Agent, or Firm—Brinks Hofer Gilson & Lione

(57) ABSTRACT

A high-speed multiplexer that includes a reduced number of components in the pull-up and/or the pull-down circuits operates faster than conventional multiplexers and can process higher frequency input signals. The pull-up circuit may be a singe p-type MOSFET transistor and the pull-down circuit may be a single n-type MOSFET transistor. The switching circuits may include transistor-based NOR gates. The multiplexer may have numerous channels, for example 2 to 256 or more channels.

24 Claims, 3 Drawing Sheets

HIGH SPEED MULTIPLEXER

BACKGROUND

Computer disk drives and other applications commonly use multiplexers. A multiplexer is a device that allows two or more signals to be transmitted simultaneously on a single communication channel. Other multiplexer switch the output channel between the input channels. Generally, multiplexers with more channels requires more time to switch between channels. Because the speed of a multiplexer determines the rate of transmission of the multiplexed data, it is desirable to have a faster multiplexer.

Hard disk drives typically include one or more rotating magnetic platters encased within a environmentally controlled housing which further includes all of the electronics and mechanics to read and write data and interface with other devices. Read/write heads are positioned above each of the platters, and typically on each face, to record and read data. The electronics of a hard disk drive are coupled with the read/write heads and include numerous components to control the position of the heads and generate or sense the electromagnetic fields representing data. The components receive data from a host device, such as a personal computer, and translate that data into magnetic encodings that are written onto the disk platters by the heads. Further, when a host device requests data from the drive, the electronics locates the desired data, senses the magnetic encodings which represent that data and translates those encodings back into the binary digital information which the host device can understand. Further, error detection and correction algorithms are applied to ensure accurate storage and retrieval of data.

One area in which significant advancements have been made has been in the area of read/write head technology and the methods of interpreting the magnetic fluctuations sensed by these heads. The read/write head, of which a typical hard disk has several, is the interface between magnetic platters and the disk drive electronics. The read/write head actually reads and writes the magnetically encoded data as areas of magnetic flux on the platters. Data, consisting of binary 1's and 0's, are encoded by sequences of the presence or absence of flux reversals recorded or detected by the read/write head. A flux reversal is a change in the magnetic flux in two contiguous areas of the disk platter. Traditional hard drives read data off the platters by detecting the voltage peak imparted in the read/write head when a flux reversal passes underneath the read/write head as the platter rotate. This is known as "peak detection." However, increasing storage densities require reduced peak amplitudes and better signal discrimination and higher platter rotational speeds are pushing the peaks closer together making peak detection more difficult to accomplish.

Magneto-resistive ("MR") read/write heads have been developed with increased sensitivity to sense smaller amplitude magnetic signals and with increased signal discrimination to address some of the problems with increasing storage densities. In addition, another technology, known as Partial Response Maximum Likelihood ("PRML"), has been developed to further address the problems with peak detection as densities and rotational speeds increase. PRML is an algorithm implemented in the disk drive electronics to interpret the magnetic signals sensed by the read/write heads. PRML based disk drives read the analog waveforms generated by the magnetic flux reversals stored on the disk. However, instead of looking for peak values to indicate flux reversals, PRML based drives digitally sample this analog waveform (the "Partial Response") and use advanced signal processing technologies to determine the bit pattern represented by that wave form (the "Maximum Likelihood"). PRML technology, in conjunction magneto-resistive ("MR") heads, have permitted manufacturers to further increase data storage densities. PRML technology further tolerates more noise in the sensed magnetic signals permitting the use of lower quality platters and read/write heads which increases manufacturing yields and lowers costs.

SUMMARY

The present invention is defined by the following claims, and nothing in this section should be taken as a limitation on those claims. By way of introduction, the preferred embodiments described below relate to A high-speed multiplexer that includes a reduced number of components in the pull-up and/or the pull-down circuits operates faster than conventional multiplexers and can process higher frequency input signals. The pull-up circuit may be a singe p-type MOSFET transistor and the pull-down circuit may be a single n-type MOSFET transistor. The switching circuits may include transistor-based NOR gates. The multiplexer may have numerous channels, for example 2 to 256 or more channels.

Further aspects and advantages of the invention are discussed below in conjunction with the preferred embodiments.

DETAILED DESCRIPTION

I. Introduction

Multiplexer have applications in numerous electronic devices. Such electronic devices are desired to operate at higher frequencies and occupy a physically smaller area. A high-speed multiplexer can switch between channels faster than a traditional multiplexer, which allows the high-speed multiplexer to handle higher frequency input signals. A multiplexer with fewer components, such as transistors in the pull-up and/or pull-down circuits will switch faster and occupy less physical space.

II. Example of a Four Channel Multiplexer

Figure 1:
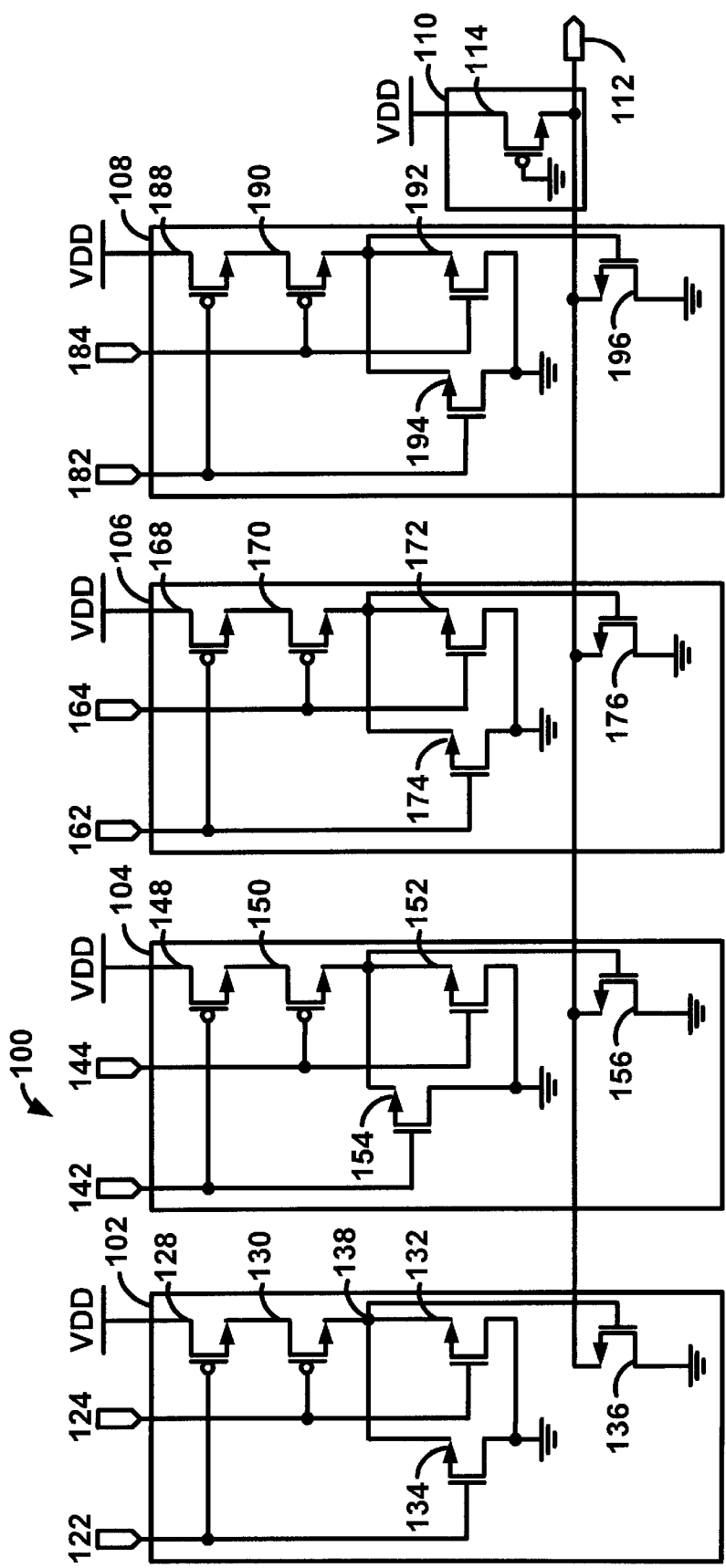
FIG. 1 illustrates a schematic diagram of an exemplary high speed multiplexer.

FIG. 1 illustrates a schematic diagram of an exemplary high-speed multiplexer 100. The high-speed multiplexer 100 includes four switching circuits 102, 104, 106, and 108 and a common pull-up circuit 110. While the high-speed multiplexer 100 is illustrated with four switching circuits, it will be apparent that the high-speed multiplexer 100 may have fewer or more switching circuits. For example, the high-speed multiplexer 100 may include two to two thousand or more switching circuits.

Each switching circuit 102, 104, 106, and 108 may be identically configured as illustrated in FIG. 1, however, variations may also be made in one or more of the switching circuits. The first switching circuit 102 receives an input signal at input node 122 and a select signal at input node 124. A four transistor NOR gate is implemented by two p-type transistors 128 and 130 and two n-type transistors 132 and 134. A pull-down circuit 136 may include an n-type transistor. The two p-type transistors 128 and 130 are connected in series with each other between a supply voltage (VDD) and the node 138. The source node of the first p-type transistor 128 is connected with the supply voltage and the drain node of the second transistor 130 being connected with the node 138. The gates of the first and second p-type transistors 128 and 130 are connected with the input nodes 122 and 124, respectively. The first and second n-type transistors 132 and 134 are connected in parallel. The gate nodes of the first and second n-type transistors 132 and 134 are connected with the input nodes 124 and 122, respectively. The drain nodes of the first and second n-type transistors 132 and 134 are connected with node 138, which is the output of the four transistor NOR gate. The gate node of the pull-down transistor 136 is connected with node 138. The drain node of the pull-down transistor 136 is connected with the output node 112. The source node of the pull-down transistor 136 is connected with ground.

The four transistor NOR gate of the first switching circuit 102 provides an output signal at node 138 in response to the two input signals at the two input. When the first input signal at node 122 and the first select signal at node 124 are low, node 138 will be driven high. When the node 138 is driven high, the pull-down circuit 136 will pull the output signal at the output node 122 to low. When either or both of the first input signal at node 122 and the first select signal at node 124 are high, the node 138 will be driven low. When the node 138 is driven low, the first switch circuit 102 will not drive a signal at the output node 122.

Similar to the first switching circuit 102, the other switching circuits 104, 106, and 108 each include a four transistor NOR gate and a pull-down circuit in a similar configuration. The four transistor NOR gate of the second switching circuit 104 includes two p-type transistors 148 and 150 and two n-type transistors 152 and 154. The four transistor NOR gate of the third switching circuit 106 includes two p-type transistors 168 and 170 and two n-type transistors 172 and 174. The four transistor NOR gate of the fourth switching circuit 108 includes two p-type transistors 188 and 190 and two n-type transistors 192 and 194. The second, third, and fourth pull-down transistors 156, 176, and 196 may be n-type transistors.

The common pull-up circuit 110 may include a transistor, such as a p-type MOS transistor 114, a pull-up resistor-based circuit, an n-type transistor coupled with an inverter, another pull-up device, or a combination of components. The common pull-up circuit 110 tends to drive the output signal at output node 112 high when none of the switching circuits are driving the output signal low. The multiplexer 100 may need only a single common pull-up circuit 110 regardless of the number of switching circuits.

Figure 3:
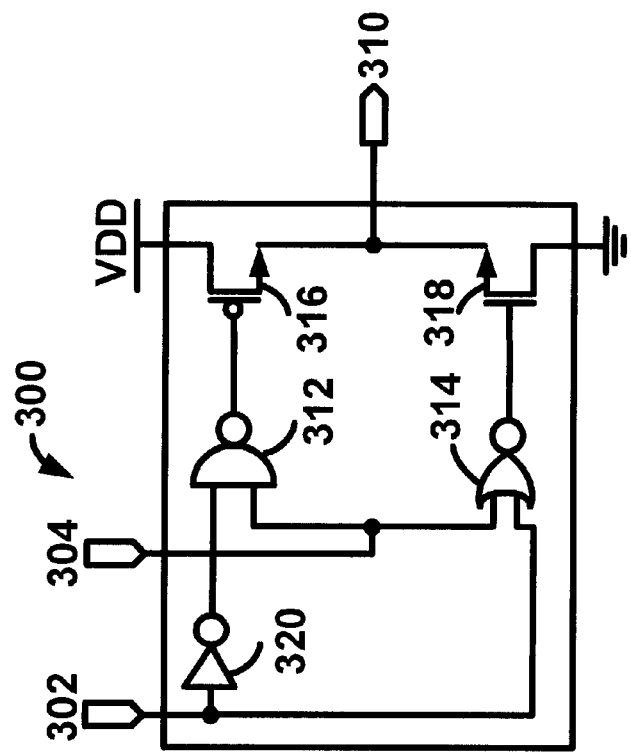
FIG. 3 illustrates a schematic diagram of a single channel of an exemplary high speed multiplexer implemented with CMOS technology.
Figure 2:
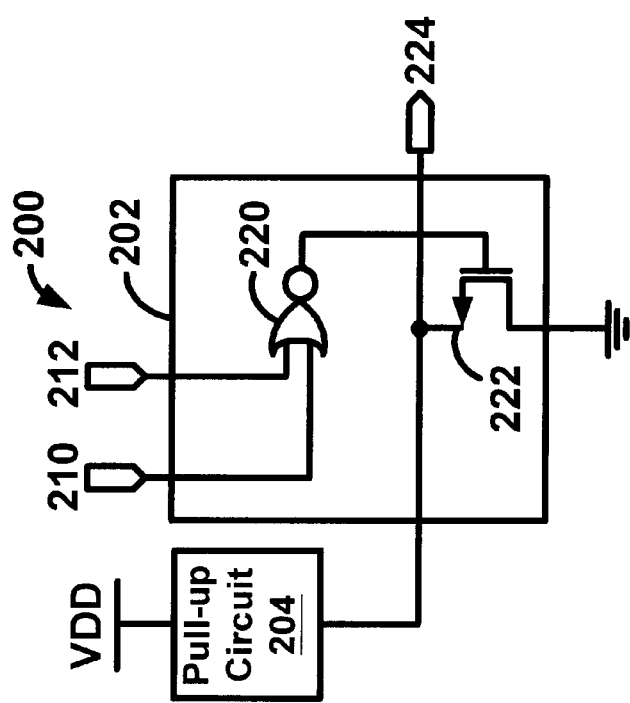
FIG. 2 illustrates a schematic diagram of a single channel and a pull-up circuit of an exemplary high speed multiplexer.

The p-type and n-type transistors describe in FIG. 1 may be metal-oxide-silicon field-effect transistors ("MOSFET" or "MOS transistor") or similar devices. In FIGS. 1–3, the drain nodes of the MOSFET transistors are indicated by an arrow pointing toward the drain node. For example, in FIG. 1, the drain node of the first p-type transistor 128 is connected with the source node of the second p-type transistor 130.

The multiplexer 100 may be fabricated as an integrated circuit. The multiplexer 100 may include only transistors, such as p-type and n-type MOSFET transistors. The multiplexer may have many switching channels, for example, 2 to 256 channels. Numerous alternative embodiments of the multiplexer 100 will be apparent and within the scope and spirit of the disclosed multiplexer 100. Some of the alternative embodiments are discussed below.

III. Example of a NOR-based Switching Circuit

FIG. 2 illustrates a schematic diagram of a channel 202, also called a switching circuit, and a pull-up circuit 204 of an exemplary multiplexer 200. The switching circuit 202 receives an input signal and a select signal at input nodes 210 and 212, respectively. The NOR gate 220 receives the input signal and a select signal and generates a output signal. The output signal from the NOR gate 220 is received by a pull-down circuit 222. The pull-down circuit 222 may be a n-type transistor. The output signal from the NOR gate 220 is received at a gate node of the n-type transistor. The source node is connected with ground and the drain node is connected with the output node 224.

The pull-up circuit 204 may be a p-type transistor, a resistor, another pull-up device or a combination of components. The pull-up circuit 204 may be connected with the output node 224. The signal at the output node 224 remains high due to the pull-up circuit 204 unless the pull-down circuit 222 pulls the signal low. The pull-down circuit 222 is stronger than the pull-up circuit 204. The high speed multiplexer 200 may include two or more switching circuits 202. Each switching circuit 202 receives an input signal and a select signal and outputs an output signal at the output node 224. The output signal is a function of the input signals and the select signals.

IV. Example of a CMOS-base Switching Circuit

FIG. 3 illustrates a schematic diagram of a channel 300 of an exemplary multiplexer implemented with CMOS technology. An input signal and a select signal are received at the input nodes 304 and 302, respectively. The select signal is connected with an input node of the NOR gate 314. An inverted select signal is connected with an input node of the NAND gate 312. The input signal is connected with an input node of the NAND gate 312 and an input node of the NOR gate 314. The output of the NAND gate 312 is connected with the gate node of the p-type transistor 316. The source of the p-type transistor 316 is connected with the supply voltage (VDD) and the drain of the p-type transistor 316 is connected with the output node 310. When the output of the NAND gate 312 is low, the p-type transistor 316 tends to drive the output node 310 high. The output of the NAND gate 312 will be low when the input signal and the inverse of the select signal are both high. The output of the NOR gate 314 is connected with the gate node of the n-type transistor 318. The source node of the n-type transistor 318 is connected with ground and the drain of the n-type transistor 318 is connected with the output node 310. A pull-up circuit (not shown) may optional be connected with the output node 310. Additional switching circuits may also be connected with the output node 310.

V. Example of an Application of the Multiplexer

Figure 4:
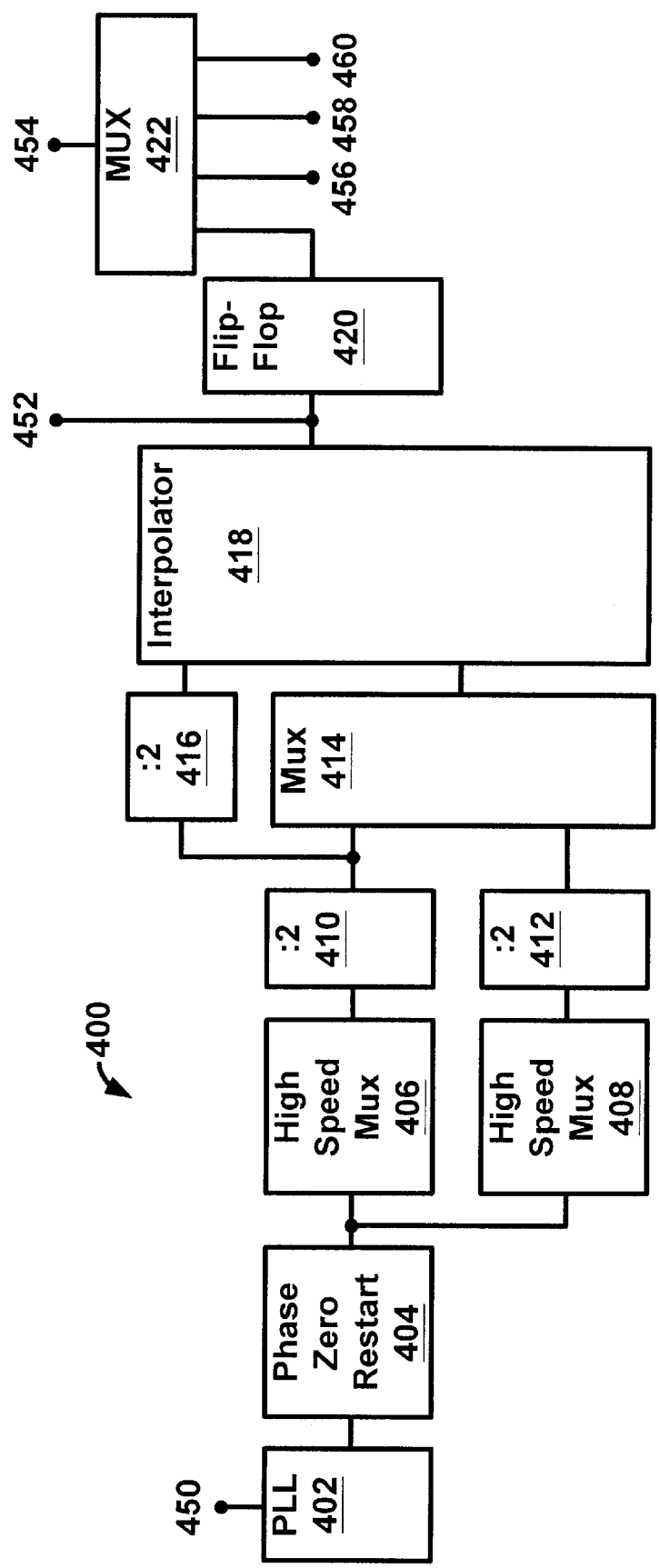
FIG. 4 illustrates a block diagram of a device that may incorporate one or more of the high speed multiplexers of FIGS. 1–3.

FIG. 4 illustrates a block diagram of a write pre-compensation circuit 400 that incorporates high speed multiplexers. The write pre-compensation circuit 400 may be used in a hard disk drive to pre-compensate the signal before the signal is written to the hard disk drive.

The write pre-compensation circuit 400 includes a phase lock loop 402, a phase zero restart 404, a plurality of high speed mulitplexers 406 and 408, frequency dividers 410, 412, and 416, a multiplexer 414, an interpolator 418, a flip-flop 420, and an output multiplexer 422. A write clock is synthesized from the phase lock loop 402. Data is received at the input node 452 to the flip-flop 420. The output data is transmitted from the output node 454.

While only one channel is illustrated in FIG. 4, the write pre-compensation circuit 400 may include a plurality of channels. The additional channels, for example three additional channels, may be connected with the output multiplexer 422, each at one of the nodes 456, 458, and 460. Each additional channel would have a pair of high speed multiplexers, frequency dividers, multiplexer, an interpolator and a flip-flop in a similar configuration as the first channel.

While FIG. 4 illustrates an application of the high speed multiplexer in a write pre-compensation circuit 400, other applications are possible. For example, the high speed multiplexer may be used in a phase lock loop or other device.

It is therefore intended that the foregoing detailed description be regarded as illustrative rather than limiting, and that it be understood that it is the following claims, including all equivalents, that are intended to define the spirit and scope of this invention.

What is claimed is:

1. A multiplexer, comprising:
   an output node;
   a first switching circuit that receives a first input signal and is operatively connected with the output node; wherein the first switching circuit comprises a first pull down circuit and a first NOR logic circuit coupled with said first pull down circuit;
   a second switching circuit that receives a second input signal and is operatively connected with the output node; wherein the second switching circuit comprises a second pull down circuit and a second NOR logic circuit coupled with said second pull down circuit; and
   a common pull-up circuit connected with the output node;
   wherein the first and second switching circuits generate an output signal at the output node in response to the first and second input signals; and further
   wherein the common pull-up circuit comprises a pull-up transistor connected with a supply voltage.

2. The multiplexer of claim 1, wherein the pull-up transistor is a p-type transistor.

3. The multiplexer of claim 1, wherein the first and second pull down circuits each comprise an n-type transistor.

4. A multiplexer, comprising:
   an output node;
   a first switching circuit that receives a first input signal and is operatively connected with the output node; wherein the first switching circuit comprises a first pull down circuit;
   a second switching circuit that receives a second input signal and is operatively connected with the output node; wherein the second switching circuit comprises a second pull down circuit; and
   a common pull-up circuit connected with the output node;
   wherein the first and second switching circuits generate an output signal at the output node in response to the first and second input signals; and further
   wherein the first and second pull down circuits each consist of an n-type transistor and the first and second pull down circuits are controlled by respective first and second NOR gates, where the first and second NOR gates each receive respective first and second select signals and the first and second input signals.

5. The multiplexer of claim 4, wherein the first and second NOR gates each comprise a CMOS NOR gate.

6. The multiplexer of claim 4, wherein the first and second NOR gates each comprise a four transistor NOR gate.

7. The multiplexer of claim 4, further comprising third and fourth switching circuits operatively connected with the output node.

8. A multiplexer, comprising:
   an output node;
   a first switching circuit that receives a first input signal and is operatively connected with the output node; wherein the first switching circuit comprises a first pull down circuit;
   a second switching circuit that receives a second input signal and is operatively connected with the output node; wherein the second switching circuit comprises a second pull down circuit; and
   a common pull-up circuit connected with the output node;
   wherein the first and second switching circuits generate an output signal at the output node in response to the first and second input signals; and further
   wherein the first and second switching circuits each comprise a pair of transistors in a complementary configuration.

9. A multiplexer, comprising:
   an output node; a first switching circuit that receives a first input signal and is operatively connected with the output node; wherein the first switching circuit comprises a single pull-down transistor; and
   a second switching circuit that receives a second input signal and is operatively connected with the output node; wherein the second switching circuit comprises a single pull-down transistor; and
   a pull-up circuit connected with the output node;
   wherein the first and second switching circuits generate an output signal at the output node in response to the first and second input signals; and further
   wherein the first and second pull down circuits each consist of a single n-type transistor and the first and second switching circuits each comprise a four transistor NOR gate.

10. The multiplexer of claim 9, wherein the first and second NOR gates each are a CMOS NOR gate.

11. The multiplexer of claim 10, wherein the pull-up circuit if a pull-up transistor connected with a supply voltage and the multiplexer consists of only one pull-up circuit.

12. The multiplexer of claim 11, wherein the pull-up transistor is a p-type transistor.

13. The multiplexer of claim 12, further comprising third and fourth switching circuits operatively connected with the output node, wherein third and fourth switching circuits each consist of a single pull-down transistor.

14. The multiplexer of claim 13, wherein the multiplexer is an integrated circuit multiplexer.

15. A write pre-compensation circuit comprising the multiplexer of claim 14.

16. A data storage device comprising the multiplexer of claim 14.

17. A multiplexer, comprising:
   an output node; a transistor-based common pull-up circuit connected with the output node; and first, second, third, and fourth switching circuits connected with the output node;
   wherein the first, second, third, and fourth switching circuits receive first, second, third, and fourth input signals, respectively and receive first, second, third, and fourth select signals, respectively, such that at most only one of the switching circuits is selected at a time and the selected switching circuit drives an output signal at the output node where the output signal is generated in response to the input signal received by the selected switching circuit; wherein the transistor-based common pull-up circuit drives a pull-up signal at the output node when the select signals are off; and further wherein the transistor-based common pull-up circuit comprises a p-type MOS transistor have a gate node connected with ground, a source node connected with a supply voltage, and a drain node connected with the output node.

18. A multiplexer, comprising:

an output node;

a transistor-based common pull-up circuit connected with the output node; and first, second, third, and fourth switching circuits connected with the output node;

wherein the first, second, third, and fourth switching circuits receive first, second, third, and fourth input signals, respectively and receive first, second, third, and fourth select signals, respectively, such that at most only one of the switching circuits is selected at a time and the selected switching circuit drives an output signal at the output node where the output signal is generated in response to the input signal received by the selected switching circuit; wherein the transistor-based common pull-up circuit drives a pull-up signal at the output node when the select signals are off; and further wherein the first, second, third, and fourth switching circuits each comprise a four transistor NOR gate.

19. The multiplexer of claim 18, wherein the first, second, third, and fourth switching circuits each further comprise a transistor-based pull-down circuit.

20. The multiplexer of claim 19, wherein the transistor-based pull-down circuits each comprise an n-type MOS transistor having a source node connected with ground, a drain node connected with the output node, and a gate node connected with the respective four transistor NOR gate.

21. A multiplexer, comprising:

an output node;

a first switching circuit that receives a first input signal and is operatively connected with the output node; wherein the first switching circuit comprises a first pull down circuit and a first NOR logic circuit coupled with said first pull down circuit;

a second switching circuit that receives a second input signal and is operatively connected with the output node; wherein the second switching circuit comprises a second pull down circuit and a second nor logic circuit coupled with said second pull down circuit; and a common pull-up circuit connected with the output node;

wherein the first and second switching circuits generate an output signal at the output node in response to the first and second input signals; and further wherein each of the first and second pull down circuits comprise a first discrete device coupled between the output node and a ground voltage.

22. The multiplexer of claim 21, wherein the common pull-up circuit further comprises a second discrete device coupled between the output node and a supply voltage.

23. The multiplexer of claim 22, wherein the second discrete device comprises a transistor, the transistor having a source and a drain, wherein the drain is coupled with the output node and the source is coupled with the supply voltage.

24. The multiplexer of claim 21, wherein the first discrete device comprises a single transistor having a source and a drain, the drain being coupled with the output node and the source being coupled with the ground voltage.

* * * * *